United States Patent [19]

Bradley

[11] Patent Number: 5,146,171

[45] Date of Patent: Sep. 8, 1992

[54] FULL REVERSING MILLIMETER TEST SET

[75] Inventor: Donald A. Bradley, Morgan Hill, Calif.

[73] Assignee: Wiltron Company, Morgan Hill, Calif.

[21] Appl. No.: 492,775

[22] Filed: Mar. 13, 1990

[51] Int. Cl.⁵ .............................................. G01R 27/04
[52] U.S. Cl. ..................................... 324/639; 324/637; 324/638; 324/642
[58] Field of Search ............... 324/630, 637, 638, 639, 324/642, 648

[56] References Cited

U.S. PATENT DOCUMENTS

| | | | |
|---|---|---|---|
| 4,680,538 | 7/1987 | Dalman et al. | 324/630 X |
| 4,803,419 | 2/1989 | Roos | 324/642 |
| 4,808,913 | 2/1989 | Grace | 324/630 X |
| 4,816,767 | 3/1989 | Cannon et al. | 324/630 X |
| 4,839,588 | 6/1989 | Jantsch et al. | 324/639 X |
| 4,853,613 | 8/1989 | Sequeira et al. | 324/638 X |

*Primary Examiner*—Kenneth A. Wieder
*Assistant Examiner*—Glenn W. Brown
*Attorney, Agent, or Firm*—Fliesler, Dubb, Meyer & Lovejoy

[57] ABSTRACT

A full reversing millimeter test set comprising a pair of test head assemblies which are connected to an analyzer by means of coaxial cables enclosed within a sheath. Microwave signals are sent to the test head assemblies and therein frequency-multiplied so as to provide the necessary millimeter test signals required for testing microwave devices in the W band of 75–110 GHz. By placing the millimeter wave components in the test head assemblies, the phase distortions which would otherwise be encountered in flexing or movement of the interconnecting coaxial cables and the bulk, signal loss and phase distortions associated with long waveguide are eliminated.

19 Claims, 3 Drawing Sheets

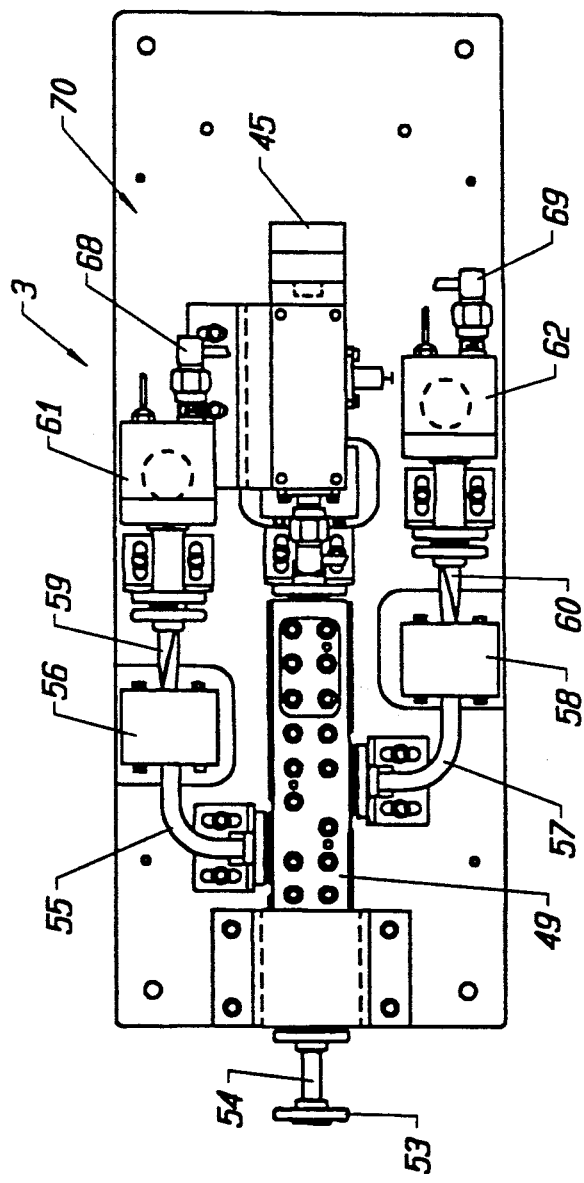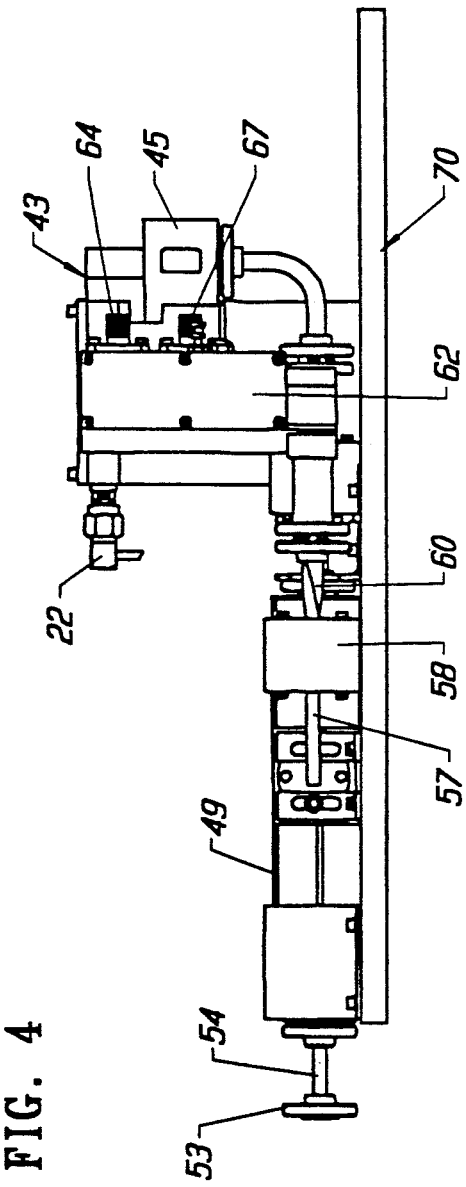
FIG. 4
FIG. 3

FULL REVERSING MILLIMETER TEST SET

BACKGROUND OF THE INVENTION

1. Field of the Invention

The present invention is related to network analyzers in general and in particular to a full reversing millimeter test set having a band width of 75-110 GHz.

2. Description of the Prior Art

A network analyzer is used for testing and measuring the electrical characteristics of a circuit device over selected frequency bands. In practice, the input and output ports of the device, commonly called a device under test, or simply a DUT, are coupled to the analyzer by means of cables, waveguide, stripline or other suitable signal transmission lines. The tests performed typically involve first injecting a test signal into the input ports of the device and measuring the magnitude and phase angle of the signal transmitted through and reflected from the input port and thereafter injecting the test signal into the output port while measuring the magnitude and phase angle of the signal transmitted through and reflected from that port.

The results of the above-described tests are called S-parameters. When the test signal is injected into the input port of the DUT, the forward S-parameters are obtained. When the test signal is injected into the output port of the DUT, the reverse S-parameters are obtained. The forward S-parameters are defined as follows:

$$S_{11} = \frac{TA}{RA}$$

$$S_{21} = \frac{TB}{RA}$$

where
- 1 identifies the DUT input port
- 2 identifies the DUT output port
- RA = the test signal applied to the DUT input port
- TA = the test signal received from the DUT input port
- TB = the test signal received from the DUT output port.

The reverse S-parameters are defined as follows:

$$S_{12} = \frac{TA}{RB}$$

$$S_{22} = \frac{TB}{RB}$$

where
- 1 identifies the DUT input port
- 2 identifies the DUT output port
- RB = the test signal applied to the DUT output port
- TA = the test signal port received from the DUT input
- TB = the test signal received from the DUT output port.

To obtain both the forward and reverse S-parameters of a DUT, the test cables must be switched between the input or output ports of the DUT or a full reversing test set must be used.

In a conventional test set using microwave test signals, i.e. signals generally having a frequency below 30 GHz, the test signals and the signals transmitted through and reflected from a DUT have typically been transmitted between the DUT and the analyzer by means of coaxial cables. It has been discovered, however, that reversing the cables or simply moving or bending the cables can produce erroneous results by introducing noise in the nature of phase distortions and the like in the signals being transmitted over the cables. This problem was recognized in U.S. Pat. No. 4,803,419 wherein the patentee proposed removing the test result signal generating means, i.e. the couplers, mixers and filters, from the analyzer proper and placing them in a test head closely coupled to the DUT.

While possibly effective at microwave signal frequencies, the patented apparatus described above makes no provision for operation at the higher millimeter wave frequencies, e.g. frequencies above 33 GHz. Signals at these frequencies are normally required to be transmitted by means of wave guide. However, the use of waveguide has been found to have several disadvantages. First, waveguide produces a loss of energy of the signal transmitted therein. Second, it is phase unstable. Third, it is bulky, cumbersome, and requires a relatively large amount of space.

In addition to requiring waveguide to transmit the test signals to and from the DUT, the conventional full reversing millimeter test set typically comprises a mechanical microwave transfer switch for selectively coupling the test signal to one of the ports while coupling a suitable termination to the other of the ports of the DUT. For example, in the typical prior known full reversing test set operable in the W band, i.e. 75-110 GHz, there is provided a four-port mechanical transfer switch comprising first and second wave guide sections which are rotatable between a first and a second position. In their first position, the first wave guide section couples a source of a test signal to the input port of the DUT while the second section couples a suitable termination to the output port of the DUT. In their second position, the first wave section couples the source of the test signal to the output of the DUT while the second section couples the termination to the input port of the DUT. The termination typically comprises a 50 ohm load.

The mechanical microwave transfer switch described above has a number of disadvantages. First, the typical transfer switch is slow in that it is motor driven and requires up to two seconds to complete a full reversal, i.e. rotation of the first and second wave guide sections between their first and second positions. Second, it is unreliable in that the switch does not park itself at a predetermined position each time it is operated. Third, it is bulky in that it typically comprises a 6-inch diameter assembly and requires a rack mounted controller with a power supply.

SUMMARY OF THE INVENTION

In view of the foregoing, principal objects of the present invention are a method and apparatus comprising a novel full reversing millimeter test set which is faster, more reliable and less bulky than prior known full reversing test sets.

In accordance with the above objects, there are provided a first and a second identical test head. The heads are coupled to a microwave vector network analyzer by means of a first and a second sheathed cable assembly, respectively.

In each of the test heads there is provided a plurality of circuits comprising in series a frequency doubler, a frequency tripler, a first isolator, the through-arm of a dual coupler having a first and a second coupling arm and a test port for coupling the head to a DUT. Coupled to each of the first and second coupling arms there is provided in series an isolator and a harmonic mixer, respectively. A power splitter provides local oscillator signals having a relatively low microwave frequency, e.g. 9.4–13.8 GHz, to the mixers. The mixers increase the frequency by a factor of eight by selecting the eighth harmonic of the local oscillator signal. To provide for both mechanical and thermal stability, the circuits in the heads are mounted on a rigid plate in a housing and the local oscillator signal lines from the power splitter to the mixers are of equal length and held close together.

In the network analyzer there is provided a plurality of circuits comprising a first power splitter, a first, second and a third amplifier, a diode pin switch, said switch having an input and a first and a second output, and a first, a second, a third and a fourth down converter.

In each of the first and second sheath cable assemblies there is provided a plurality of coaxial cables. The coaxial cables are provided for transmitting the microwave signals between the first and second test heads and the network analyzer with a high degree of phase stability so that the phase of the signals therein is not changed when the cables are flexed. Additionally, the cables are protected by an outer sheath which provides temperature stability.

In operation, the first test head is coupled to the input port of the DUT and the second test head is coupled to the output port of the DUT. A radio frequency (r.f.) signal having a frequency range of 12.5–18.3 GHz is selectively switched by the diode pin switch between the first and second heads. When the r.f. signal is switched from the first to the second head, the forward and reverse S-parameters are obtained, respectively.

In addition to the fact that the use of a diode pin switch for switching the test signal between the heads provides for extremely rapid measurements of the S-parameters, e.g. less than 1 msec., the isolator in series with the through-arm of the coupler in each head provides an excellent termination for the DUT.

BRIEF DESCRIPTION OF THE DRAWINGS

The above and other objects, features and advantages of the present invention will become apparent from the following detailed description of the accompanying drawings, in which:

FIG. 3 is a partial side elevation view of the test head of FIG. 2; and

FIG. 4 is a top plan view of FIG. 3.

DETAILED DESCRIPTION OF THE INVENTION

Figure 1:
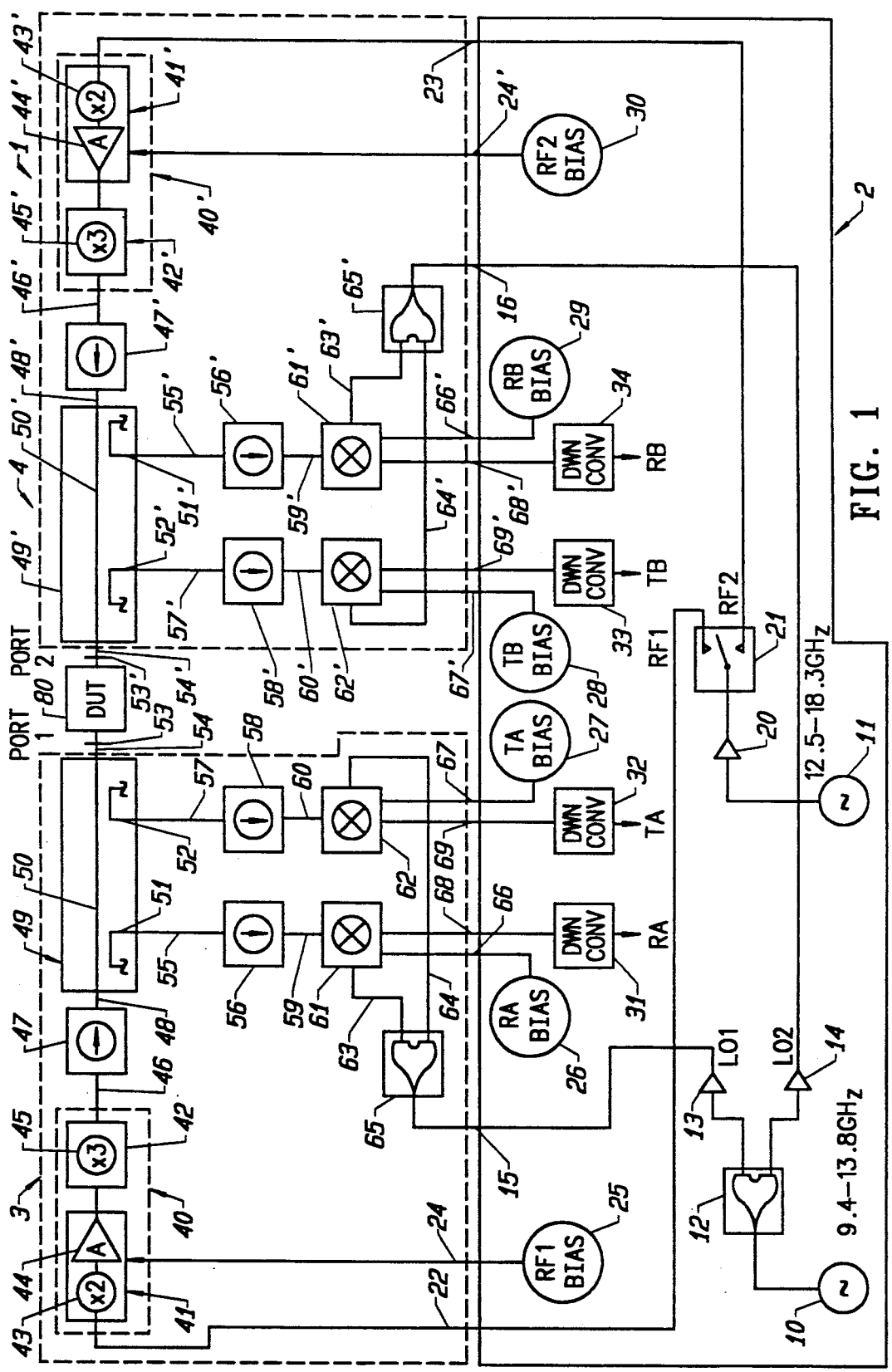
FIG. 1 is a partial block diagram of a full reversing millimeter test set according to the present invention.

Referring to FIGS. 1, 2, 3 and 4, there is provided in accordance with the present invention a full reversing millimeter test set designated as 1. In the test set 1 there is provided a signal analyzer 2, a first test head assembly 3 and a second test head assembly 4.

In the signal analyzer 2 there is provided a first oscillator 10 for providing a local oscillator signal having a frequency range of from 9.4 to 13.8 GHz and a second oscillator 11 for providing an r.f. signal having a frequency range of from 12.5 to 18.3 GHz. The oscillator 10 is coupled to an input of a two-output power splitter 12. The outputs of the power splitter 12 are coupled to a pair of buffers 13 and 14. The outputs of the buffers 13 and 14 provide a pair of local oscillator signals designated LO1 and LO2 on a pair of signal lines 15 and 16, respectively. As will be further described below, signal lines 15 and 16 are coupled to test head assemblies 3 and 4, respectively.

The oscillator 11 is coupled by means of an amplifier 20 to the common input of a diode pin switch 21. Diode pin switch 21 selectively provides on a pair of output signal lines 22 and 23 an r.f. signal RF1 and RF2, respectively.

In addition, there is provided in the analyzer 2 a plurality of bias sources including an RF1 bias source 25 and RA bias source 26, a TA bias source 27, a TB bias source 28, an RB bias source 29 and an RF2 bias source 30 and a plurality of down converters, including a down converter 31 for providing an output signal RA, a down converter 32 for providing an output signal TA, a down converter 33 for providing an output signal TB and a down converter 34 for providing an output signal RB.

The test head assemblies 3 and 4 are identical and, accordingly, only test head assembly 3 will be described in detail and a primed version of the numbers used for identifying components in test head assembly 3 will be used to identify the same components in test head assembly 4.

Referring to test head assembly 3, there is provided in assembly 3 a frequency multiplying circuit designated generally as 40. In the circuit 40 there is provided an active frequency multiplier circuit 41, and a passive frequency multiplier circuit 42. In the frequency multiplier circuit 41 there is provided a frequency doubler 43 and an amplifier 44. The circuit 42 comprises a frequency tripling circuit 45.

The input of the circuit 40 is coupled to the analyzer 2 by means of the r.f. signal line 22 and the RF1 bias source 25 is coupled to the circuit 40 by means of a line 24. The r.f. signal line 22 comprises a coaxial cable. Coupled to the output of the tripling circuit 45 by means of a waveguide 46 there is provided a source input isolator 47. Coupled to the output of the isolator 47 by means of a waveguide 48 there is provided a dual directional coupler 49 having a through-arm 50 and a first and a second coupling arm 51 and 52, respectively. One end of the through-arm 50 is coupled to the waveguide 48 and the opposite end of the through-arm 50 is coupled to a test port fitting 53 by means of a waveguide 54. The fitting 53 is provided for coupling a DUT 80 to the assembly.

The first coupling arm 51 is coupled by means of a waveguide 55 to an incident power output isolator 56. The coupling arm 52 is coupled by means of a waveguide 57 to a reflected power output isolator 58. The outputs of the isolators 56 and 58 are coupled by means of a waveguide 59 and 60 to an incident power harmonic mixer 61 and a reflected power harmonic mixer 62, respectively.

Coupled to the mixers 61 and 62 by means of a pair of coaxial cables 63 and 64, there is provided a harmonic mixer signal splitter 65. Splitter 65 has an input for receiving the local oscillator signal LO1 on the signal line 15. The signal line 15 also comprises a coaxial cable. Bias circuits 26 and 27 in the analyzer 2 are coupled to the mixers 61 and 62 by means of a pair of coaxial cables 66 and 67, respectively. Intermediate frequency, e.g.

270 MHz, output signals RA and TA from the mixers 61 and 62 are provided to down converters 31 and 32 in the analyzer 2 by means of coaxial cables 68 and 69, respectively.

In operation, with the diode pin switch 21 connecting the output of the oscillator 11 to the signal line 22, the forward signal parameters are measured. When the diode pin switch 21 connects the oscillator 11 to the signal line 23, the reverse signal parameters are measured. An important feature of the present invention is that the source input isolators 47 and 47' provide an excellent termination of approximately 50 ohms for the DUT coupled to the ports 53 and 53' when the reverse and forward parameters are being measured, respectively.

To obtain the necessary millimeter test signal, the frequency of the output of the oscillator 11 is multiplied in the frequency multiplying circuits 40 and 40', depending on whether the forward or reverse signal parameters are being measured. The harmonic mixers 61 and 61' and 62 and 62' operate on the eighth harmonic of the output of the oscillator 10 such that the eighth harmonic is mixed with the output from the couplers 49, 49' so as to provide an intermediate frequency of 270 MHz on the output of the mixers 61 and 62 and 61' and 62'.

Figure 2:
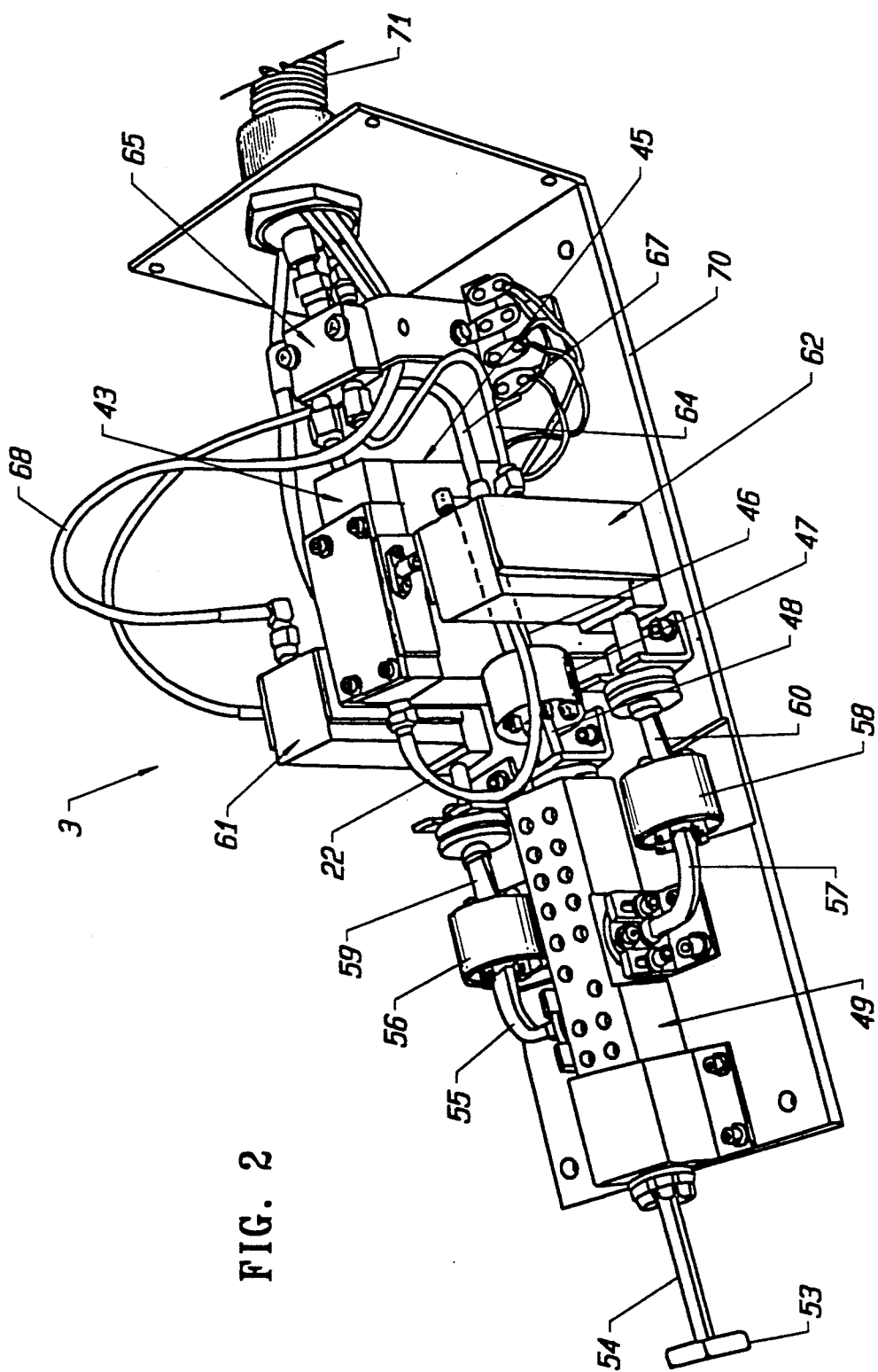
FIG. 2 is a perspective view of a test head assembly according to the present invention.

The components described as being located in the test head assemblies 3 and 4 are mounted on a rigid chassis 70, as seen more clearly in FIGS. 2–4. The coaxial cables 22, 23, 24, 24', 66, 67, 68, 69, 66', 67', 68' and 69' are all enclosed within a flexible sheath 71. The chassis 70 and the housing (not shown) fitted thereon and the sheath 71 provide thermal stability for the components mounted on the chassis 70 and the coaxial cables enclosed within the sheath 71. By placing the millimeter wave components on the chassis 70 and enclosing them within a temperature stable housing, phase instability and distortions caused by movement of the coaxial cables interconnecting the test head assemblies and the analyzer 2 are substantially eliminated. Moreover, nearly instantaneous full reversing millimeter measurements can be made by simply switching diode pin switch 21 as described above.

While a preferred embodiment of the present invention is described above, it is contemplated that various modifications may be made thereto without departing from the spirit and scope thereof. Accordingly, it is intended that the embodiment described above be considered only as an illustration of the present invention and that the scope thereof should not be limited thereto but be determined by reference to the claims hereinafter provided and their equivalents.

What is claimed is:

1. For use in a full reversing millimeter test set having a pair of identical test head assemblies wherein a first one of said test head assemblies is used for processing a test signal transmitted to and reflected from a device under test (DUT) and a second one of said test head assemblies is used for processing a signal transmitted through said DUT, a test head assembly comprising:

isolator means for isolating a source of said test signal from a test signal reflected from said DUT when said test head assembly is processing a test signal transmitted to and reflected from said DUT and for terminating said DUT when said test head assembly is processing a test signal transmitted through said DUT;

means for sampling said test signal and a signal reflected from or transmitted through said DUT in response to said test signal;

means coupled to said sampling means for providing a first intermediate frequency signal comprising characteristics of said test signal and a second intermediate frequency signal comprising characteristics of said signal reflected from or transmitted through said DUT in response to said test signal; and means for transmitting said first and said second intermediate frequency signals to an analyzer for analyzing said intermediate signals.

2. A test head assembly according to claim 1 comprising:

means responsive to an r.f. signal having a first frequency for providing said test signal, said test signal having a second frequency;

means for coupling said test signal providing means to a source of said r.f. signal having said first frequency; and means including waveguide means coupled to said test signal providing means for transmitting said test signal to said device under test (DUT).

3. A test head assembly according to claim 2 wherein said means for providing said test signal comprises a frequency multiplying means.

4. A test head assembly according to claim 3 wherein said frequency multiplying means comprises an active frequency multiplying means and a passive frequency multiplying means.

5. A test head assembly according to claim 4 wherein said active frequency multiplying means comprises a frequency doubling means and said passive frequency multiplying means comprises a frequency tripling means.

6. A test head assembly according to claim 5 wherein said frequency doubling means has a gain of approximately 3 db and said frequency tripling means has an attenuation of approximately 9.5 db.

7. A test head assembly according to claim 2 wherein said first frequency is in the range of from 12.5 GHz to 18.3 GHz and said means for coupling said test signal providing means to a source of said r.f. signal having said first frequency comprises coaxial cable means.

8. A test head assembly according to claim 2 wherein said waveguide means coupled to said test signal providing means for transmitting said test signal to said DUT comprises:

a microwave coupler having a through-arm; and
   waveguide means for coupling said test signal providing means and said DUT to said through-arm of said coupler.

9. A test head assembly according to claim 2 wherein said means for sampling said test signal and said signal reflected from or transmitted through said DUT in response to said test signal comprises a microwave coupler having a first and a second coupling arm.

10. A test head assembly according to claim 2 comprising a microwave coupler having a through-arm, a first coupling arm and a second coupling arm, and wherein said means coupled to said test signal providing means for transmitting said test signal to said DUT comprises said through-arm, said means for sampling said test signal comprises said first coupling arm, and said means for sampling said signal reflected from or transmitted through said DUT in response to said test signal comprises said second coupling arm.

11. A test head assembly according to claim 2 wherein said second frequency is at least 75 GHz.

12. A test head assembly according to claim 1 wherein said sampling means provides a first and a second baseband signal and said means coupled to said sampling means for providing a first intermediate frequency signal comprising characteristics of said test signal and a second intermediate frequency signal comprising characteristics of said signal received from said DUT in response to said test signal comprises:
 harmonic mixing means;
 means for coupling said harmonic mixing means to said sampling means and to a source of a mixer input signal having a first frequency; and
 means responsive to said mixer input signal having said first frequency for providing a mixed signal having a second frequency, said mixing means including means for mixing said first and said second baseband signal with said mixed signal having said second frequency for providing said first and said second intermediate frequency signals.

13. A test head assembly according to claim 12 wherein said second frequency of said mixed signal is eight times higher than said first frequency of said mixer input signal.

14. A full reversing millimeter test set for measuring the electrical characteristics of a device under test (DUT) comprising:
 a first and a second test head assembly, each of said assemblies having
 (a) means for coupling said assembly to a source of an r.f. signal having a first frequency,
 (b) means responsive to said r.f. signal having said first frequency for providing a test signal having a second frequency,
 (c) a source input isolator,
 (d) means for coupling said source input isolator to said test signal providing means,
 (e) a microwave coupler having a through-arm, a first coupling arm and a second coupling arm,
 (f) means for coupling said through-arm to said source input isolator and to said DUT,
 (g) an incident power output isolator and a reflected power output isolator coupled to said first and said second coupling arms, respectively,
 (h) a first and a second mixer coupled to said incident power output isolator and said reflected power output isolator, respectively, said mixers including means responsive to a mixing signal having a first frequency for providing a mixing signal having a second frequency and means responsive to a baseband signal from said incident power output isolator and said reflected power output isolator and said mixing signal having said second frequency for providing a first and a second intermediate frequency signal, respectively, said first intermediate frequency signal having characteristics corresponding to said test signal and said second intermediate frequency signal having characteristics corresponding to a signal received from said DUT in response to said test signal,
 (i) means for coupling said first and said second mixer to a source of said mixing signal having said first frequency, and
 (j) means for coupling said first and said second intermediate frequency signals to a signal analyzer;
 switching means for selectively providing said r.f. signal having said first frequency to said first and said second test head assembly; and
 means for providing said mixing signal having said first frequency to each of said mixers in said first and said second test head assembly.

15. A full reversing millimeter test set for measuring the electrical characteristics of a device under test (DUT) according to claim 14 wherein said means for coupling said assembly to a source of an r.f. signal having a first frequency, said means for coupling said first and said second mixer to a source of said mixing signal having said first frequency and said means for coupling said first and said second intermediate frequency signals to a signal analyzer comprises coaxial cable means; and said means for coupling said source input isolator to said test signal providing means and said through-arm, said through-arm to said DUT, said incident power output isolator and said reflected power output isolator to said first and said second coupling arms and said incident power output isolator and said reflected power output isolator to said first and said second mixers comprises waveguide means.

16. A full reversing millimeter test set for measuring the electrical characteristics of a device under test (DUT) according to claim 14 wherein said means for coupling said first and said second mixers in each of said test head assemblies to a source of said mixing signal having said first frequency comprises a power splitter and first and second coaxial cable means for coupling said power splitter to each of said mixers, respectively, said coaxial cable means comprising approximately equal lengths of coaxial cable between said splitter and each of said mixers.

17. A test head assembly for testing a microwave device comprising:
 means responsive to an r.f. signal having a first frequency for providing a test signal having a second frequency, said test signal providing means comprising an active frequency multiplying means and a passive frequency multiplying means;
 means for coupling said test signal providing means to a source of said r.f. signal having said first frequency;
 means coupled to said test signal providing means for transmitting said test signal to said device under test (DUT);
 means for sampling said test signal and a signal received from said DUT in response to said test signal;
 means coupled to said sampling means for providing a first intermediate frequency signal comprising characteristics of said test signal and a second intermediate frequency signal comprising characteristics of said signal received from said DUT in response to said test signal; and
 means for transmitting said first and said second intermediate frequency signals to an analyzer for analyzing said signals.

18. A test head assembly according to claim 17 wherein said active frequency multiplying means comprises a frequency doubling means and said passive frequency multiplying means comprises a frequency tripling means.

19. A test head assembly according to claim 18 wherein said frequency doubling means has a gain of approximately 3 db and said frequency tripling means has an attenuation of approximately 9.5 db.

* * * * *

UNITED STATES PATENT AND TRADEMARK OFFICE
CERTIFICATE OF CORRECTION

PATENT NO. : 5,146,171

DATED : September 8, 1992

INVENTOR(S) : Donald A. Bradley

It is certified that error appears in the above-identified patent and that said Letters Patent is hereby corrected as shown below:

Column 8, line 58, insert before "signals" --intermediate--.

Signed and Sealed this

Twenty-eighth Day of September, 1993

Attest:

BRUCE LEHMAN

Attesting Officer

Commissioner of Patents and Trademarks